United States Patent
Irish et al.

(10) Patent No.: US 9,985,071 B2
(45) Date of Patent: May 29, 2018

(54) ACTIVE AREA SELECTION FOR LIDAR RECEIVERS

(71) Applicant: QUALCOMM Incorporated, San Diego, CA (US)

(72) Inventors: Linda Irish, San Diego, CA (US); William Henry Von Novak, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 140 days.

(21) Appl. No.: 15/257,714

(22) Filed: Sep. 6, 2016

(65) Prior Publication Data

US 2017/0301716 A1   Oct. 19, 2017

Related U.S. Application Data

(60) Provisional application No. 62/323,515, filed on Apr. 15, 2016.

(51) Int. Cl.
*H01L 27/146* (2006.01)
*G01S 7/486* (2006.01)
*G01S 7/487* (2006.01)
*G01J 1/44* (2006.01)

(52) U.S. Cl.
CPC ......... *H01L 27/14643* (2013.01); *G01J 1/44* (2013.01); *G01S 7/4863* (2013.01); *H01L 27/14609* (2013.01); *H01L 27/14612* (2013.01); *H01L 27/14636* (2013.01); *H01L 27/14641* (2013.01); *G01J 2001/4466* (2013.01); *G01S 7/487* (2013.01)

(58) Field of Classification Search
CPC ......... H01L 27/14643; H01L 27/14641; H01L 27/14636; H01L 27/14612; H01L 27/14609; G01S 7/487

USPC .................................................... 250/208.1
See application file for complete search history.

(56) References Cited

U.S. PATENT DOCUMENTS

| | | | | |
|---|---|---|---|---|
| 7,262,402 B2 * | 8/2007 | Niclass | ............ | H01L 27/14647 250/208.1 |
| 8,314,446 B2 * | 11/2012 | Yao | ................... | H01L 27/14603 257/184 |
| 2013/0015331 A1 | 1/2013 | Birk et al. | | |
| 2013/0099100 A1 | 4/2013 | Pavlov | | |

(Continued)

FOREIGN PATENT DOCUMENTS

EP   2708914 A1   3/2014

OTHER PUBLICATIONS

International Search Report and Written Opinion—PCT/US2017/022199—ISA/EPO—dated Jun. 30, 2017.

*Primary Examiner* — Seung C Sohn
(74) *Attorney, Agent, or Firm* — Kilpatrick Townsend & Stockton/Qualcomm

(57) ABSTRACT

Techniques provided herein are directed toward providing an optical sensor that reduces noise from sources of light other than the LIDAR transmitter by changing the active area of the sensor of a LIDAR receiver. The optical sensor may include a two dimensional array of single photon avalanche devices (SPADs) with row-select and column-select transistors, where rows and columns are selected based on a predicted spot size and angle of reflected laser light detected at the LIDAR receiver. Among other things, this can eliminate or reduce the need for moving parts within the LIDAR receiver.

20 Claims, 5 Drawing Sheets

(56) References Cited

U.S. PATENT DOCUMENTS

2013/0277561 A1 10/2013 Woolaway et al.
2014/0078491 A1 3/2014 Eisele et al.
2014/0168632 A1 6/2014 Eisele et al.
2015/0219764 A1 8/2015 Lipson
2015/0293034 A1 10/2015 Makuuchi et al.

* cited by examiner

ACTIVE AREA SELECTION FOR LIDAR RECEIVERS

BACKGROUND

Light Detection And Ranging (LIDAR) is a surveying technology that measures distance by illuminating a target with a laser light and reading a pulse corresponding to the reflected laser light. LIDAR is often utilized to determine the topology of a landscape, and LIDAR is commonly used in modern vehicles to help determine distances between the vehicles and objects in their surroundings. However, because the sensor of a LIDAR receiver can be so sensitive, it is vulnerable to noise from light from sources of light other than the LIDAR transmitter.

SUMMARY

Techniques provided herein are directed toward providing an optical sensor that reduces noise from sources of light other than the LIDAR transmitter by changing the active area of the sensor of a LIDAR receiver. The optical sensor may include a two dimensional array of single photon avalanche devices (SPADs) with row-select and column-select transistors, where rows and columns are selected based on a predicted spot size and angle of reflected laser light detected at the LIDAR receiver. Among other things, this can eliminate or reduce the need for moving parts within the LIDAR receiver.

An example optical sensor, according to the disclosure, comprises and array of SPADs having a plurality of rows and a plurality of columns. Each SPAD may have a resistive element, a capacitive element, and a photo detection element, and further comprises a first input, a second input, and an output. Each row of the plurality of rows may have a corresponding row-select transistor that, when activated, causes the first input of each SPAD in the row to receive a bias voltage. Each column of the plurality of rows may have a corresponding column-select transistor connected with the second input of each SPAD in the column. For each column, the output of each SPAD in the column may be connected with a column output for that column.

Embodiments of the optical sensor can include one or more of the following features. The photo detection element of each SPAD may comprise an avalanche photodiode (APD). The row-select transistors and column-select transistors may comprise bipolar junction transistors (BJTs). The row-select transistors and column-select transistors may comprise field-effect transistors (FETs). Each SPAD may comprise a resistor coupled between the capacitive element and the output of the SPAD. Each column output may be further connected to an input of a trans impedance amplifier.

An example method of activating a portion of an array of single photon avalanche devices (SPADs) having a plurality of rows and a plurality of columns, according to the disclosure, comprises activating the portion of the array of SPADs by providing a bias voltage to each SPAD in a subset of the plurality of rows and a subset of the plurality of columns, and reading an output of each of the plurality of columns in the array of SPADs.

The method may further comprise one or more of the following features. Each SPAD may comprise an avalanche photodiode (APD). The method further may comprise using row-select bipolar junction transistors (BJTs) and column-select BJTs to provide the bias voltage to each SPAD in the subset of the plurality of rows and the subset of the plurality of columns. The method further may comprise using row-select field-effect transistors (FETs) and column-select FETs to provide the bias voltage to each SPAD in the subset of the plurality of rows and the subset of the plurality of columns. Each SPAD may comprise a resistor coupled between a capacitive element and the output of the SPAD. Reading the output of each of the plurality of columns in the array of SPADs may comprise amplifying the output of each of the plurality of columns in the array of SPADs with a trans impedance amplifier. The method may further comprise using a processing unit to provide the bias voltage to each SPAD in the subset of the plurality of rows and the subset of the plurality of columns by activating row-select and column-select transistors.

An example apparatus, according to the disclosure, comprises means for activating a portion of an array of single photon avalanche devices (SPADs) having a plurality of rows and a plurality of columns SPADs by providing a bias voltage to each SPAD in a subset of the plurality of rows and a subset of the plurality of columns, and means for reading an output of each of the plurality of columns in the array of SPADs.

The apparatus further may comprise one or more of the following features. Each SPAD may comprise an avalanche photodiode (APD). The means for activating the portion of an array of SPADs may comprise row-select bipolar junction transistors (BJTs) and column-select BJTs. The means for activating the portion of an array of SPADs may comprise row-select field-effect transistors (FETs) and column-select FETs. Each SPAD may comprise means for providing an electrical resistance coupled between a capacitive means and the output of the SPAD. The means for reading the output of each of the plurality of columns in the array of SPADs further may comprise means for amplifying the output of each of the plurality of columns in the array of SPADs. The means for activating the portion of an array of SPADs may comprise processing means for providing the bias voltage to each SPAD in the subset of the plurality of rows and the subset of the plurality of columns by activating row-select and column-select transistors.

BRIEF DESCRIPTION OF THE DRAWINGS

An understanding of the nature and advantages of various embodiments may be realized by reference to the following figures.

DETAILED DESCRIPTION

The ensuing description provides embodiment(s) only, and is not intended to limit the scope, applicability or configuration of the disclosure. Rather, the ensuing description of the embodiment(s) will provide those skilled in the art with an enabling description for implementing an embodiment. It is understood that various changes may be made in the function and arrangement of elements without departing from the spirit and scope of this disclosure.

This disclosure is generally related toward enabling a selectable area and a Light Detection And Ranging (LIDAR) receiver to provide for more favorable signal-to-noise ratios, although embodiments are not so limited. It will be understood that the techniques provided herein can be utilized in other applications (e.g., 3D and/or medical imaging), and for other desired results.

LIDAR is a surveying technology that measures distance by illuminating a target with a laser light (e.g., one or more laser beams from a LIDAR transmitter) and reading a pulse corresponding to the reflected laser light. LIDAR is often utilized to determine the topology of a landscape, and LIDAR is commonly used in modern vehicles (e.g., to implement self-driving and/or other features) to help determine distances between the vehicles and objects in their surroundings. In some implementations, for example, the pulse can be on the order of 300 ps.

Figure 1:
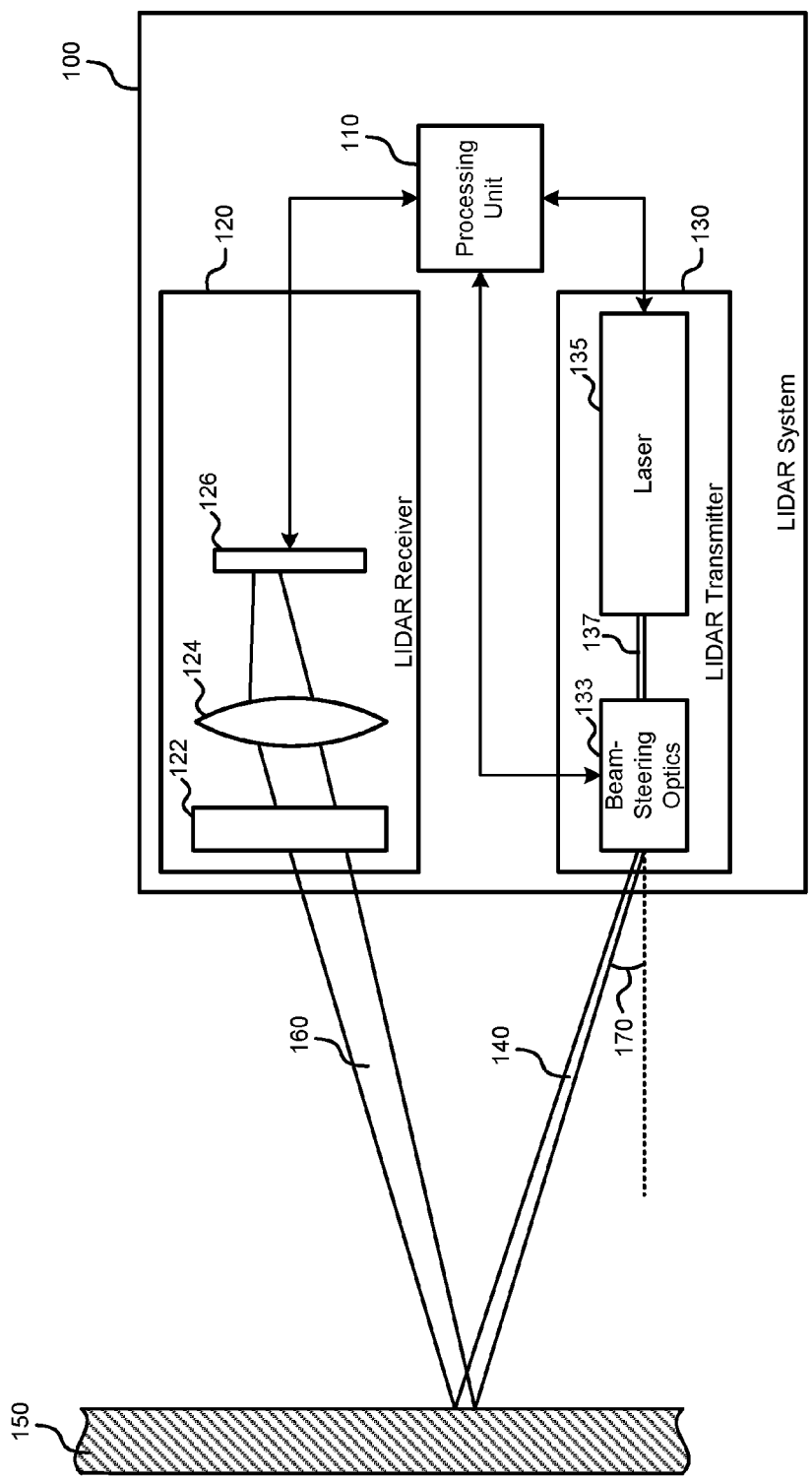
FIG. 1 is a simplified block diagram of a LIDAR system that can utilize the techniques discussed herein, according to one embodiment.

FIG. 1 is a simplified block diagram of an embodiment of a LIDAR system, which illustrates the basics functionality of a LIDAR system. As illustrated, a LIDAR system 100 can comprise a LIDAR transmitter 130 (which includes a laser 135 and beam-steering optics 133), a LIDAR receiver 120 (which includes filtering optics 122, focusing optics 124, and a sensor 126), and a processing unit 110. A person of ordinary skill in the art will recognize that alternative embodiments of a LIDAR system 100 may include additional or alternative components to those shown in FIG. 1. For example, components may be added, removed, combined, or separated, depending on desired functionality, manufacturing concerns, and/or other factors. In some embodiments, for example, the LIDAR receiver and the LIDAR transmitter may have separate processing units or other circuitry controlling the operation thereof.

In general, the operation of the LIDAR system 100 is as follows. The processing unit 110 causes the laser 135 to generate a laser beam 137 that is fed to the beam-steering optics. The beam-steering optics 133 adjusts the direction and/or spot size of the laser beam 137 (using, for example, a Risley prism pair, micro electromechanical systems (MEMS) reflectors, and/or other means) to create a transmitted laser beam 140 that scans a field of view (FOV) of the LIDAR system 100. (It can be noted that the direction of the transmitted laser beam 140 may be measured by an angle 170 from an axis of the beam-steering optics 133. It can further be noted that the axis may arbitrarily be determined, and that multiple angles may be used to extend this idea in two (or more dimensions.) In so doing, the transmitted laser beam 140 reflects off an object 150 within the FOV, creating a reflected laser beam 160 that is detected by the LIDAR receiver 120. The filtering optics 122 can be used to filter out unwanted light (e.g., wavelength of light other than the wavelength(s) generated by the laser 135), and the focusing optics 124 can be used to project to the reflected laser beam 160 onto a light-sensing surface of the sensor 126. The sensor 126 can then provide information to the processing unit 110 that enables the processing unit 110 to determine a distance of the object. As the beam-steering optics 133 scans the entire FOV of the LIDAR system 100, reflected laser light is received by the LIDAR receiver, and the processing unit 110 is able to determine the distance of many objects within the entire FOV of the LIDAR system 100.

The sensor 126 of the LIDAR receiver may comprise a high speed sensor such as an avalanche photo diode (APD) or silicon photomultiplier. The signal-to-noise ratio (SNR) degrades as light from sources other than the LIDAR transmitter falls onto the photodetector. For example, light from the sun creates shot noise. For good SNR, the filtering optics 122 and the focusing optics 124 can be designed to put as much light that originated from the LIDAR transmitter as possible onto the sensor 126, while minimizing light from other sources.

The sensor 126 can comprise a silicon photomultiplier (SiPM) which includes an array of single photon avalanche devices (SPADs, also referred to herein as "SPAD microcells" or "SPAD cells") where a single photon can trigger a SPAD for a brief period of time. During the time a SPAD is triggered, may no longer be sensitive to light. That is, when a photon is detected by a SPAD, the SPAD goes into saturation and remains there until the capacitive element of the SPAD is discharged, thereby creating a spike at the output (that is measured by downstream circuitry such as the processing unit 110 to determine, for example, a measured distance). If the SPADs are made small and connected together with quenching resistors, the output of the SiPM is a function of the light reaching the photodetector. It will be appreciated that, although embodiments described herein utilize SPADs, other embodiments may utilize other photon detection means.

Because SiPMs can be so sensitive, the sensor 126 can be vulnerable to noise (i.e., light other than the reflected laser beam 160). And although filtering optics 122 help reduce the amount of this noise, it does not eliminate it. Furthermore, in situations where other LIDAR systems are operating in the vicinity of the LIDAR system 100 (such as when multiple car-based LIDAR systems are in use in high-density traffic), filtering optics 122 may not filter out light generated from the LIDAR transmitters of other LIDAR systems 100.

According to the techniques presented herein, SNR may be further increased by selectively activating only a portion of the sensor 126 that is expected to be illuminated by the reflected laser beam 160. In other words, because the beam-steering optics 133 determines the angle 170 and the spot size of the transmitted laser beam 140 at any given time during the operation of the LIDAR system 100, the LIDAR system 100 can further determine the expected angle and spot size of the reflected laser beam 160. With this information, the LIDAR system 100 can then determine which SPADs of the sensor 126 are likely to be illuminated by the reflected laser light. As such, and according to techniques disclosed herein, the SNR for the sensor 126 can be further improved by utilizing a sensor 126 having a SiPM capable of dynamically changing its active area in both location and size. Among other things, this can eliminate or reduce the need for moving parts within the LIDAR receiver.

Figure 2:
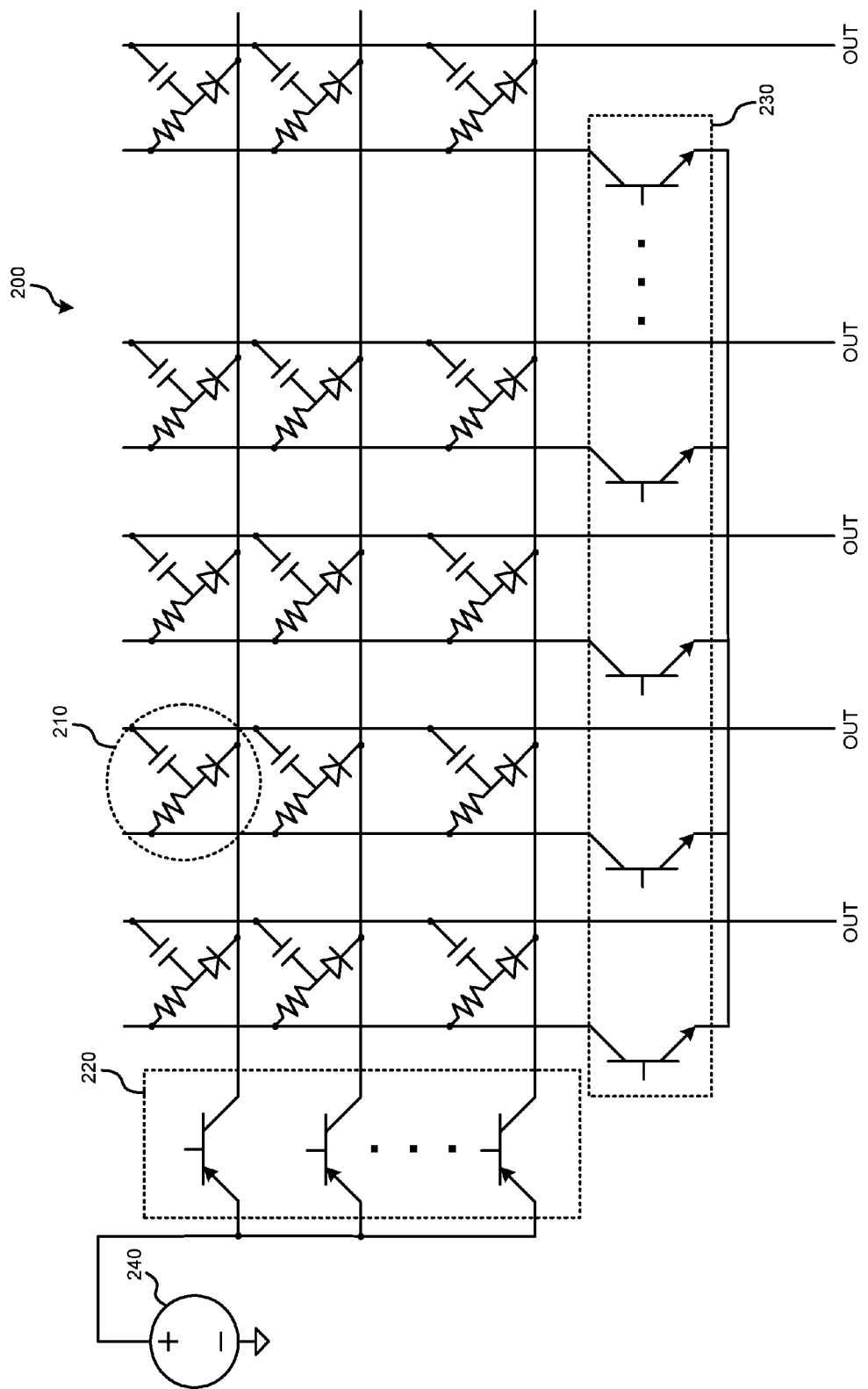
FIG. 2 is a simplified schematic diagram of a silicon photomultiplier (SiPM), according to one embodiment.

FIG. 2 is a simplified schematic diagram of a SiPM 200, according to one embodiment. As mentioned above, the SiPM 200 may be Incorporated into the sensor 126 of FIG. 1. Here, the SiPM comprises an array of SPADs, wherein each SPAD 210 comprises resistive, capacitive, and photo sensitive elements, such as a resistor, a capacitor, and a photodiode, respectively. A person of ordinary skill in the art will appreciate typical values and/or other properties of these elements, which may vary depending on desired functionality. In some embodiments, for example, values of capacitance may be in the femtofarad range, and the resistance used in the implementation could be over a wide range of values, depending on how the array design is optimized. For example, in some embodiments, the RC time constant of the capacitance acting against the quench resistor may be 10 nS or less. In these embodiments, the resistor in series with each capacitor in FIG. 3 could be anywhere from zero (e.g., the resistor is omitted) to any value producing an RC time constant shorter than 10 nS. Other embodiments may have values above and/or below the values of this example.

It will be understood that the size of the array can vary, depending on desired functionality. That is, although the SiPM 200 illustrated in FIG. 2 has only 25 SPADs illustrated, embodiments may have a larger or smaller number of SPADs, depending on desired functionality. Some embodiments may include, for example, hundreds, thousands, or millions of SPADs, or more. In some embodiments, the entire SiPM (and optionally some of the additional circuitry shown in FIG. 2) may be implemented on a single semiconductor die. A person of ordinary skill in the art will appreciate the fact that various modifications can be made to the basic layout shown in FIG. 2. It can be further noted that, although the array is described as a SiPM 200, some embodiments may utilize photomultipier arrays that utilize materials in addition or as an alternative to silicon.

In this embodiment, the SiPM 200 utilizes a plurality of row-select transistors 220, as well as a plurality of column-select transistors 230, enabling controlling circuitry (such as a microprocessor or other processing circuit) to, by activating these transistors, select which SPADs in the array to use for sensing at a particular moment. In other words, these row-select transistors 220 and column-select transistors 230 can, when activated, enable the controlling circuitry to "activate" a certain subset of the SiPM 200. Depending on desired functionality, manufacturing concerns, and/or other factors, these transistors could comprise NPN, PNP, N- or P-channel MOSFETs, or other types. Generally speaking, the size of the transistor may be big enough to have a on resistance between drain and source (RDS (on)) that is substantially smaller than all the quench resistors in parallel driven by that transistor, or small enough to drive the worst-case current needed by the row or column without more than a couple volt drop. In some embodiments, the voltage rating may be 30V or possibly more. However, this might vary depending on the photodetector used.

A SPAD and APD are both sensitive to the amount of bias voltage, which is set by bias voltage 240. Up to the breakdown voltage of the sensor, the gain of the SPAD and APD may be up to one electron per photon. Due to the efficiency of the sensor, the actual sensitivity may be substantially less than one electron per photon. But as the bias voltage increases to the breakdown voltage and beyond, the sensitivity of the APD and SPAD increases. For the arrangement of the SiPM SPAD microcells into a matrix with the cathodes connected to rows and anodes connected to columns (as shown in FIG. 2), an area of high gain cells can be achieved by driving bias voltage into rows and columns to select an active area with high gain. The unselected cells without the high reverse bias have a very low gain while the active area (selected using row- and column-select transistors) has a gain of 20^5 or more. By selection of multiple adjacent rows and multiple adjacent columns, a desired square or rectangular area can be selected. Alternatively, some embodiments may be modified to allow a non-rectangular area may be selected.

The grouping of the SPAD cells can be column by column, row by row, or an arbitrary grouping of SPAD cells without regard to all the cells falling on the same row or column. It can be noted that the structure illustrated in FIG. 2 (as well as the structure of FIG. 3 below) will work if the anodes and cathodes are swapped, or rows and columns are interchanged, as long as the polarity of drive at the SPAD cells is reverse biased.

The signal level from each SPAD may be quite high. This value depends on how many SPAD cells are connected together. For example, a single SPAD cell on its own may produce 5V, but if it is connected together in the same column with 1000 other SPAD cells, the loading of the other cells would drop that voltage to 5 mV. other embodiments may include higher or lower signal levels, depending on desired functionality. In some embodiments, for smaller arrays of SPADs, all of the capacitive coupled cell outputs could be tied together to form a single output. Unbiased SPAD cells would create minimal response to being hit by a photon, while biased cells will have very high gain in terms of electrons per photon. As the array size gets larger, the capacitive coupled outputs may need to be broken into groups of microcells and connected to a multiplexer or peak detector to prevent the signal level from getting too small due to voltage division amongst the connected cells. According to some embodiments, if a set of switches or multiplexer is used, it may be at the output of each row in FIG. 3 (after the amplifier). Alternative embodiments may connect rows before each amplifier, but the signal from the active cells would be divided by the total number of cells. For extremely large arrays (e.g., arrays having several hundred microcells or more) the microcell groups could be amplified before being summed or multiplexed. This would further improve the signal to noise ratio by preventing the signal from becoming too weak before amplification.

It can be noted that, in FIG. 2, combining circuitry (such as multiplexers and/or amplifiers) is not shown, but may be used depending on desired functionality. The columns of the SiPM 200 each have an output (labeled "OUT" in FIG. 2) that is utilized to detect an output of the SiPM 200. If combining circuitry is utilized, it could combine one or more of these column outputs in a manner similar to the embodiment illustrated in FIG. 3.

Figure 3:
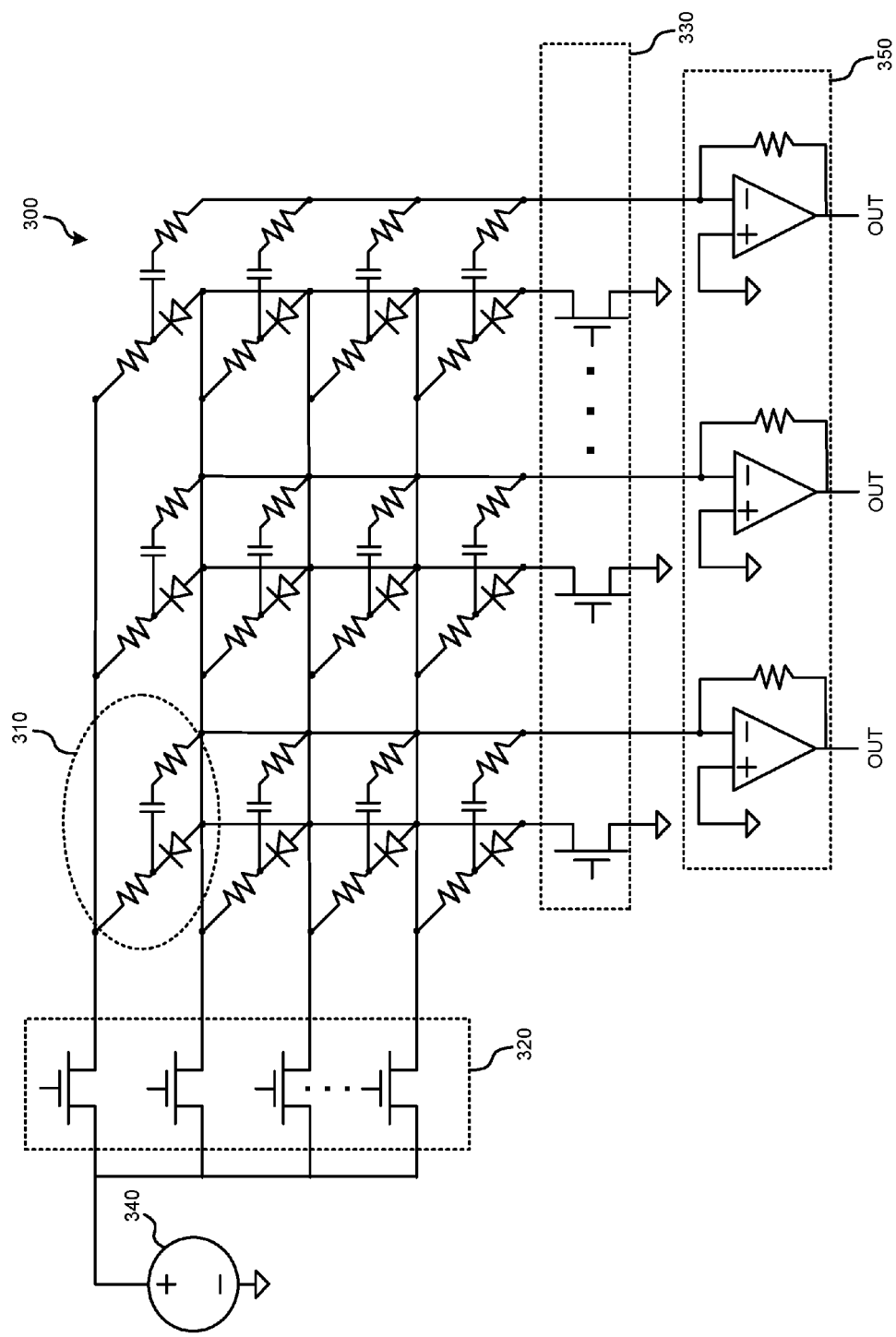
FIG. 3 is a simplified schematic diagram of a SiPM, according to a different embodiment.

FIG. 3 is a simplified schematic diagram of a SiPM 300, according to a different embodiment. Here, the row-select transistors 320 and the column select transistors 330 are field-effect transistors (FETs). Other embodiments may additionally or alternatively include other types of transistors, depending on manufacturing concerns, desired functionality, and/or other factors. Each SPAD cell 310 differs slightly from the SPAD cells 210 of FIG. 2 in that the SPAD cells 310 of FIG. 3 include an additional output resistor element to reduce the effects of the capacitances of other SPADs. The lower-drive-strength signal is then amplified by a layer of trans impedance amplifiers (TIAs) 350 to increase drive strength before being passed on for detection. It can be noted that broadband amplifiers may be utilized in addition or as an alternative to the TIAs 350. It can be further noted that the SiPM 200 of FIG. 2 may utilize TIAs 350 in a similar manner.

It should be noted, however, that such output resistive elements are optional. Embodiments utilizing bipolar junction transistors (BJTs) and/or FETs (such as those illustrated in FIGS. 2 and 3 respectively) may choose to include or omit such additional resistive elements, depending on desired functionality. The presence and/or value of such additional resistive elements can determine how an output pulse is shaped. A person having ordinary skill in the art will appreciate the factors that may be utilized in determining whether to include such additional resistive elements and what values they may be. In some embodiments, these resistive elements may simply be parasitic resistive elements.

As with FIG. 2, embodiments may employ a larger or smaller number of SPADs than is illustrated in the SiPM 300 illustrated in FIG. 3, depending on desired functionality. Again, embodiments may include, for example, hundreds, thousands, or millions of SPADs (or more).

As indicated previously, bias voltages 240 and 340 utilized in FIGS. 2 and 3, respectively, can be chosen to determine the sensitivity of the SPADs, when activated (via row- and column-select transistors). In some embodiments, these bias voltages may be dynamic, enabling the SiPM to provide a variably-sensitive output depending on, for example, lighting conditions and/or other factors. Adjusting the bias voltage of the SPAD can change the sensitivity. The value of bias would likely be the same for all of the cells that are active (with the inactive cells unbiased). In other embodiments, these bias voltages may be static and/or factory set.

In a LIDAR application, the active rows and columns can be selected a microsecond or more before the laser fires. As indicated previously, the row- and/or column-select signals used to activate the row-select transistors 220, 320 and column-select transistors 230, 330 can be generated by a processing unit or other logic (e.g., processing unit 110 of FIG. 1) which may be in communication with and/or control of LIDAR transmission circuitry. As such, the processing unit or other logic may know the angle and/or spot size at which the LIDAR transmission circuitry will transmit a laser beam, and can select the rows and columns of the SPADs in the SiPM corresponding to the known angle and/or spot size. With the corresponding SPADs of the SiPM activated when the LIDAR transmission circuitry fires the laser beam (and the rest of the SPADs remaining inactive), this will enable the SiPM to provide a higher SNR, resulting in more accurate LIDAR functionality.

Figure 4:
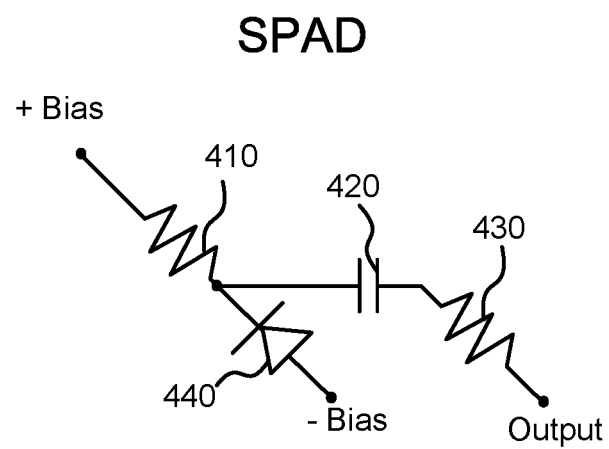
FIG. 4 is a schematic diagram of a single photon avalanche device (SPAD), according to an embodiment.

FIG. 4 is a schematic diagram of a single SPAD, according to an embodiment. Here, the SPAD includes a current-limiting or bias/quench resistor 410, a high-speed capacitive structure 420, an optional output resistor 430, and a photodiode 440. As indicated above, the input bias voltage can determine the sensitivity of the photo detection. A value for the current-limiting or bias/quench resistor 410 can be determined to limit the amount of current drawn when the photodiode 440 detects light. Values for the capacitive structure 420 and the optional output (decoupling) resistor 430 may be determined by known techniques based on requirements for the circuitry utilized to combine and/or measure the output of the SPADs. According to some embodiments, all components of the SPAD (and indeed the entire SiPM and optionally supporting circuitry, such as TIAs) may be implemented on a single semiconductor die. Such a die may be packaged in an integrated circuit (IC) package and utilized in larger LIDAR or other imaging devices.

Figure 5:
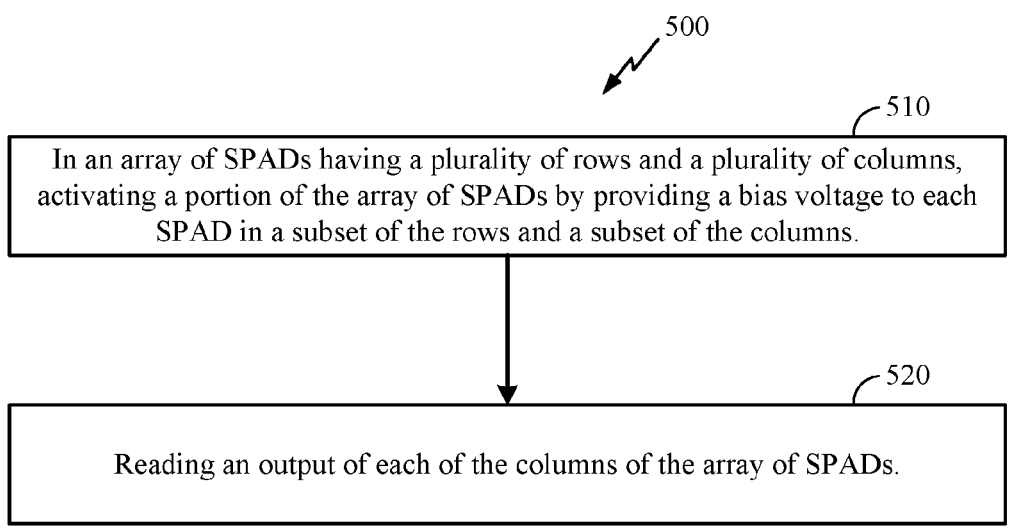
FIG. 5 is a flow diagram of a method 400 for enabling the activation of a portion of a SiPM, according to some embodiments.

FIG. 5 is a flow diagram of a method 500 of enabling the activation of a portion of a SiPM, according to some embodiments. It will be understood that alternative embodiments may utilize additional or alternative functions from those illustrated in FIG. 5.

At block 510, in an array of SPADs having a plurality of rows and a plurality of columns, a portion of the array of SPADs is activated by providing a bias voltage to each SPAD in a subset of the rows and a subset of the columns. As illustrated in the embodiments shown in FIGS. 2-3, the bias voltage may be provided to the inputs of each SPAD by activating corresponding row-select and/or column-select transistors. In some embodiments, each SPAD comprises resistive, capacitive, and photo detection elements electrically connected with, a first input, a second input, and an output, each row of the plurality of rows has a corresponding row-select transistor that, when activated, causes the first inputs of each SPAD in the row to receive a bias voltage, each column of the plurality of rows has a corresponding column-select transistor connected with the second inputs of each SPAD in the column, and for each column, the outputs of each SPAD in the column are connected with a column output for that column. As described previously, the activation of such transistors can be done with a processing unit (such as a microprocessor) and/or other logic configured to generate signals to activate the transistors. The rows and columns selected for activation may correspond with those SPADs that are expected to receive reflected laser light (this determination may also be made by the processing unit and/or other logic).

At block 520, and output of each of the columns of the array of SPADs is read. As indicated previously, this may be done by any of a variety of types of circuitry. In some embodiments, to ensure these outputs are read accurately, a multiplexor may be utilized to read only the outputs of the columns of SPADs selected at block 510. Additionally or alternatively, these outputs may be amplified by TIAs and/or other types of amplifiers. In some embodiments, the outputs may be provided to a processing unit (such as the processing unit 110 of FIG. 1) and/or other processing circuitry.

As with other embodiments described herein, the method 500 illustrated in FIG. 5 may vary, depending on desired functionality. For example, transistors utilized in block 510 may comprise bipolar junction transistors (BJTs) and/or field-effect transistors (FETs). Each SPAD may include an output resistor coupled with an output of the SPAD.

It will be apparent to those skilled in the art that substantial variations may be made in accordance with specific requirements. For example, customized hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" as used herein, refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including but not limited to, non-volatile media, volatile media, and transmission media. Common forms of computer-readable media include, for example, magnetic and/or optical media, punchcards, papertape, any other physical medium with patterns of holes, a RAM, a PROM, EPROM, a FLASH-EPROM, any other memory chip or cartridge, a carrier wave as described hereinafter, or any other medium from which a computer can read instructions and/or code.

The methods, systems, and devices discussed herein are examples. Various embodiments may omit, substitute, or add various procedures or components as appropriate. For instance, features described with respect to certain embodiments may be combined in various other embodiments. Different aspects and elements of the embodiments may be combined in a similar manner. The various components of the figures provided herein can be embodied in hardware and/or software. Also, technology evolves and, thus, many of the elements are examples that do not limit the scope of the disclosure to those specific examples.

It has proven convenient at times, principally for reasons of common usage, to refer to such signals as bits, information, values, elements, symbols, characters, variables, terms, numbers, numerals, or the like. It should be understood, however, that all of these or similar terms are to be associated with appropriate physical quantities and are merely convenient labels. Unless specifically stated otherwise, as is apparent from the discussion above, it is appreciated that throughout this Specification discussions utilizing terms such as "processing," "computing," "calculating," "determining," "ascertaining," "identifying," "associating," "measuring," "performing," or the like refer to actions or processes of a specific apparatus, such as a special purpose computer or a similar special purpose electronic computing device. In the context of this Specification, therefore, a special purpose computer or a similar special purpose electronic computing device is capable of manipulating or transforming signals, typically represented as physical electronic, electrical, or magnetic quantities within memories, registers, or other information storage devices, transmission devices, or display devices of the special purpose computer or similar special purpose electronic computing device.

Terms, "and" and "or" as used herein, may include a variety of meanings that also is expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AA, AAB, AABBCCC, etc.

Having described several embodiments, various modifications, alternative constructions, and equivalents may be used without departing from the spirit of the disclosure. For example, the above elements may merely be a component of a larger system, wherein other rules may take precedence over or otherwise modify the application of the invention. Also, a number of steps may be undertaken before, during, or after the above elements are considered. Accordingly, the above description does not limit the scope of the disclosure.

What is claimed is:

1. An optical sensor comprising:
   an array of single photon avalanche devices (SPAD) having a plurality of rows and a plurality of columns, wherein:
      each SPAD has a resistive element, a capacitive element, and a photo detection element, and further comprises a first input, a second input, and an output;
      each row of the plurality of rows has a corresponding row-select transistor that, when activated, causes the first input of each SPAD in the row to receive a bias voltage;
      each column of the plurality of rows has a corresponding column-select transistor connected with the second input of each SPAD in the column; and
      for each column, the output of each SPAD in the column is connected with a column output for that column.

2. The optical sensor of claim 1, wherein the photo detection element of each SPAD comprises an avalanche photodiode (APD).

3. The optical sensor of claim 1, wherein the row-select transistors and column-select transistors comprise bipolar junction transistors (BJTs).

4. The optical sensor of claim 1, wherein the row-select transistors and column-select transistors comprise field-effect transistors (FETs).

5. The optical sensor of claim 1, wherein each SPAD comprises a resistor coupled between the capacitive element and the output of the SPAD.

6. The optical sensor of claim 1, wherein each column output is further connected to an input of a trans impedance amplifier.

7. A method of activating a portion of an array of single photon avalanche devices (SPADs) having a plurality of rows and a plurality of columns, the method comprising:
   activating the portion of the array of SPADs by providing a bias voltage to each SPAD in a subset of the plurality of rows and a subset of the plurality of columns; and
   reading an output of each of the plurality of columns in the array of SPADs.

8. The method of claim 7, wherein each SPAD comprises an avalanche photodiode (APD).

9. The method of claim 7, further comprising using row-select bipolar junction transistors (BJTs) and column-select BJTs to provide the bias voltage to each SPAD in the subset of the plurality of rows and the subset of the plurality of columns.

10. The method of claim 7, further comprising using row-select field-effect transistors (FETs) and column-select FETs to provide the bias voltage to each SPAD in the subset of the plurality of rows and the subset of the plurality of columns.

11. The method of claim 7, wherein each SPAD comprises a resistor coupled between a capacitive element and the output of the SPAD.

12. The method of claim 7, wherein reading the output of each of the plurality of columns in the array of SPADs comprises amplifying the output of each of the plurality of columns in the array of SPADs with a trans impedance amplifier.

13. The method of claim 7, further comprising using a processing unit to provide the bias voltage to each SPAD in the subset of the plurality of rows and the subset of the plurality of columns by activating row-select and column-select transistors.

14. An apparatus comprising:
   means for activating a portion of an array of single photon avalanche devices (SPADs) having a plurality of rows and a plurality of columns SPADs by providing a bias voltage to each SPAD in a subset of the plurality of rows and a subset of the plurality of columns; and
   means for reading an output of each of the plurality of columns in the array of SPADs.

15. The apparatus of claim 14, wherein each SPAD comprises an avalanche photodiode (APD).

16. The apparatus of claim 14, wherein the means for activating the portion of an array of SPADs comprises row-select bipolar junction transistors (BJTs) and column-select BJTs.

17. The apparatus of claim 14, wherein the means for activating the portion of an array of SPADs comprises row-select field-effect transistors (FETs) and column-select FETs.

18. The apparatus of claim 14, wherein each SPAD comprises means for providing an electrical resistance coupled between a capacitive means and the output of the SPAD.

19. The apparatus of claim 14, wherein the means for reading the output of each of the plurality of columns in the array of SPADs further comprises means for amplifying the output of each of the plurality of columns in the array of SPADs.

20. The apparatus of claim 14, wherein the means for activating the portion of an array of SPADs comprises processing means for providing the bias voltage to each SPAD in the subset of the plurality of rows and the subset of the plurality of columns by activating row-select and column-select transistors.

* * * * *